US009837171B2

(12) United States Patent
Kang

(10) Patent No.: US 9,837,171 B2
(45) Date of Patent: Dec. 5, 2017

(54) BUILT-IN SELF-TEST CIRCUIT AND SEMICONDUCTOR DEVICE INCLUDING THE SAME

(71) Applicant: SK hynix Inc., Gyeonggi-do (KR)

(72) Inventor: Hee-Won Kang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 17 days.

(21) Appl. No.: 15/195,202

(22) Filed: Jun. 28, 2016

(65) Prior Publication Data

US 2016/0307644 A1   Oct. 20, 2016

Related U.S. Application Data

(62) Division of application No. 14/286,748, filed on May 23, 2014, now Pat. No. 9,405,648.

(30) Foreign Application Priority Data

Dec. 3, 2013  (KR) .................... 10-2013-0149202

(51) Int. Cl.
| G11C 29/00 | (2006.01) |
| G11C 29/38 | (2006.01) |
| G06F 11/27 | (2006.01) |
| G01R 31/3187 | (2006.01) |
| G11C 29/44 | (2006.01) |
| G11C 29/16 | (2006.01) |
| G11C 29/36 | (2006.01) |

(52) U.S. Cl.
CPC .......... *G11C 29/38* (2013.01); *G01R 31/3187* (2013.01); *G06F 11/27* (2013.01); *G11C 29/16* (2013.01); *G11C 29/36* (2013.01); *G11C 29/44* (2013.01)

(58) Field of Classification Search
CPC ..... G11C 29/38; G11C 31/3187; G11C 29/16; G06F 11/27
See application file for complete search history.

(56) References Cited

U.S. PATENT DOCUMENTS

| 6,959,256 B2* | 10/2005 | Basto ..................... G11C 29/10 |
| | | 702/117 |
| 7,181,659 B2* | 2/2007 | Bravo ..................... G11C 29/16 |
| | | 714/718 |
| 7,246,277 B2* | 7/2007 | Lukanc .................. G11C 29/12 |
| | | 702/118 |
| 7,434,131 B2* | 10/2008 | Mukherjee ....... G01R 31/31724 |
| | | 714/718 |
| 7,631,236 B2* | 12/2009 | Gorman ........... G01R 31/31724 |
| | | 714/718 |
| 7,882,406 B2* | 2/2011 | Andreev .......... G01R 31/31724 |
| | | 365/185.01 |
| 8,156,391 B2* | 4/2012 | Andreev ................ G11C 29/32 |
| | | 714/718 |

(Continued)

*Primary Examiner* — Esaw Abraham
(74) *Attorney, Agent, or Firm* — IP & T Group LLP

(57) ABSTRACT

A built-in self-test circuit includes a command storage unit that stores commands inputted from an external device, an input/output control unit that controls the command storage unit to sequentially store the commands and sequentially output stored commands as internal commands in a test operation, and a command decoder unit that decodes the internal commands outputted from the command storage unit and outputs a test command.

8 Claims, 6 Drawing Sheets

(56) References Cited

U.S. PATENT DOCUMENTS

| | | | | |
|---|---|---|---|---|
| 8,588,017 B2* | 11/2013 | Park | ............ | G11C 11/40618 |
| | | | | 365/185.12 |
| 8,839,057 B2* | 9/2014 | Hughes | ............ | G11C 29/16 |
| | | | | 714/718 |
| 8,892,387 B2* | 11/2014 | Bruzzano | ....... | G01R 31/318536 |
| | | | | 702/117 |
| 8,935,586 B2* | 1/2015 | Chickanosky | ... | G01R 31/31724 |
| | | | | 324/73.1 |
| 9,087,614 B2* | 7/2015 | Son | ............ | G11C 29/4401 |
| 9,436,567 B2* | 9/2016 | Gorti | ............ | G06F 11/27 |

* cited by examiner

BUILT-IN SELF-TEST CIRCUIT AND SEMICONDUCTOR DEVICE INCLUDING THE SAME

CROSS-REFERENCE TO RELATED APPLICATIONS

This application is a division of U.S. patent application Ser. No. 14/286,748 filed on May 23, 2014, which claims priority of Korean Patent Application No. 10-2013-0149202, entitled "BUILT-IN SELF-TEST CIRCUIT AND SEMICONDUCTOR DEVICE INCLUDING THE SAME" and filed on Dec. 3, 2013. The disclosure of each of the foregoing applications is incorporated herein by reference in its entirety.

TECHNICAL FIELD

Exemplary embodiments of the present invention relate to a semiconductor design technology, and more particularly, to a built-in self-test circuit and a semiconductor device including the same.

BACKGROUND

Integrated circuit technology involves integrating many elements into one semiconductor device. With increased complexity in semiconductor devices, various testing methods have been proposed.

External stand-alone machine type test devices are common. However, memory, such as that in a microprocessor memory device or an embedded memory device, which has no pad or similar means of access, may not be tested using stand-alone machine type testing devices.

Therefore, putting a built-in self-test circuit (BIST) into the semiconductor device has been proposed. However, in the conventional built-in self-test circuit (BIST) a test for all commands may not be performed making the test coverage is low.

Each of the tests verifies normal memory device operation in different ways leaving possibly different results between the various testing methods. Therefore, testing methods are not perfect and may fail to accurately analyze the functionality of a given semiconductor device.

SUMMARY

Exemplary embodiments of the present invention are directed to a semiconductor device capable of performing a test for all commands.

Exemplary embodiments of the present invention are directed to a semiconductor device that recognizes sequences of all commands without an external controller and includes a test logic substantially the same as various test applications of a test device.

In accordance with an exemplary embodiment of the present invention, a built-in self-test circuit may include a command storage unit suitable for storing commands inputted from an external device, an input/output control unit suitable for controlling the command storage unit to sequentially store the commands and sequentially output stored commands as internal commands in a test operation, and a command decoder unit suitable for decoding the internal commands outputted from the command storage unit and outputting a test command.

In accordance with another exemplary embodiment of the present invention, a semiconductor device may include a test circuit suitable for receiving external commands, sequentially storing the external commands, and sequentially outputting stored commands as test commands in a test operation, and a memory core unit suitable for operating in response to the test commands from the test circuit in the test operation, wherein the test circuit and the memory core unit form a semiconductor memory device.

The test circuit may include a command storage unit suitable for storing the eternal commands, an input/output control unit suitable for controlling the command storage unit to sequentially store the external commands and sequentially output the stored commands as internal commands in the test operation, and a command decoder unit suitable for decoding the internal commands outputted from the command storage unit and outputting the test commands.

The memory core unit may be provided in a plurality of slave chips, and the test circuit may be provided in a master chip.

The memory core unit may be provided in a plurality of slave chips, the command storage unit and the command decoder unit may be provided in one of the plurality of slave chips, and the input/output control unit may be provided in a master chip.

A further exemplary embodiment of a semiconductor memory device may include an input/output control unit suitable for generating a plurality of input control signals in response to a clock signal and generating a plurality of output control signals in response to the clock signal and an output enable signal in a test operation, a test command generating unit suitable for sequentially storing external commands in response to the plurality of input control signals and sequentially output stored commands as test commands in response to the plurality of output control signals in the test operation, and a memory core unit suitable for operating in response to the test commands in the test operation.

In the semiconductor device of previous embodiments, commands are stored in the semiconductor device to control itself in a test operation so an external controller is not necessary, resulting in a reduction in time and energy consumed.

Furthermore, test coverage is improved by having test commands in the controller that are capable of driving the memory cells.

DETAILED DESCRIPTION

Figure 1:
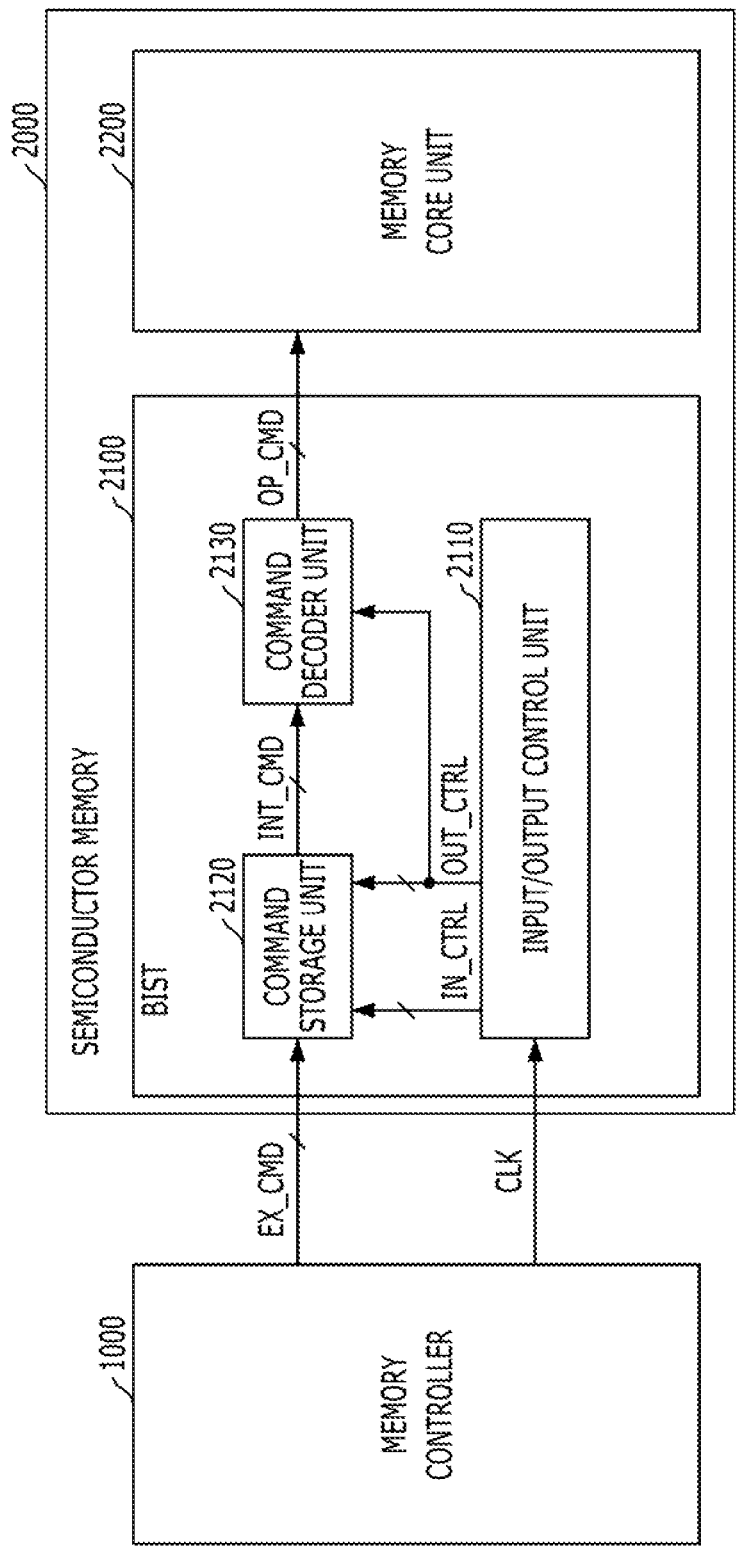
FIG. 1 is a block diagram illustrating a semiconductor device including a built-in self-test circuit in accordance with a first exemplary embodiment of the present invention.

Various examples and implementations of the disclosed technology are described below in detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor device including a built-in self-test circuit in accordance with a first exemplary embodiment of the present invention.

Referring to FIG. 1, the semiconductor device may include a memory controller 1000 and a semiconductor memory 2000.

The memory controller 1000 provides the semiconductor memory 2000 with external commands EX_CMD and a clock signal CLK. The external commands EX_CMD may include command signals such as CS, RAS, CAS, WE, and CKE.

The semiconductor memory 2000 may include a built-in self-test circuit 2100 and a memory core unit 2200, wherein the built-in self-test circuit 2100 may include an input/output control unit 2110, a command storage unit 2120, and a command decoder unit 2130.

The input/output control unit 2110 receives the clock signal CLK from the memory controller 1000, sequentially stores the external commands EX_CMD in the command storage unit 2120, and controls internal commands INT_CMD to be sequentially outputted in a test operation.

The external commands EX_CMD are latched by an input control signal IN_CTRL outputted from the input/output control unit 2110, are converted to the internal commands INT_CMD, and are sequentially stored in the command storage unit 2120. Then, the internal commands INT_CMD are sequentially outputted by an output control signal OUT_CTRL from the input/output control unit 2110 in the test operation.

The command decoder unit 2130 decodes the internal commands INT_CMD in response to the output control signal OUT_CTRL, and outputs a test command OP_CMD. The test command OP_CMD is an operation command for driving of the memory core unit 2200, and may include active, read, write, refresh, precharge commands and the like.

Since the semiconductor memory 2000 initially receives the external commands EX_CMD from the memory controller 1000 only once, stores the internal commands INT_CMD in the command storage unit 2120, and uses the internal commands INT_CMD in the test operation, the stored internal commands INT_CMD are not erased. Accordingly, nonvolatile flash memory may be used as the command storage unit 2120.

The configuration and operation of the built-in self-test circuit 2100 will be described in detail with reference to FIG. 2.

Figure 2:
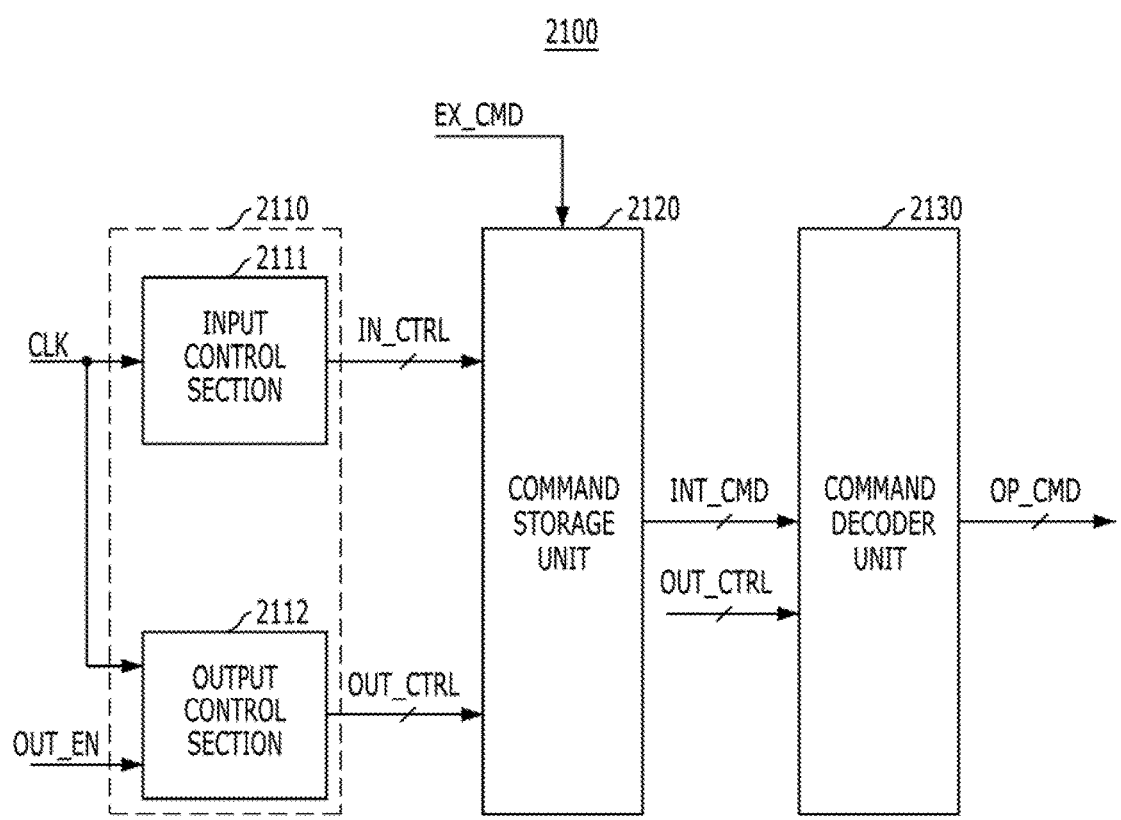
FIG. 2 is a detailed block diagram of a built-in self-test circuit illustrated in FIG. 1 in accordance with an exemplary embodiment of the present invention.

FIG. 2 is a detailed block diagram of the built-in self-test circuit illustrated in FIG. 1.

Referring to FIG. 2, the built-in self-test circuit 2100 may include an input/output control unit 2110 having an input control section 2111 and an output control section 2112, a command storage unit 2120, and a command decoder unit 2130.

The input control section 2111 receives the clock signal CLK and generates a plurality of input control signals IN_CTRL for controlling the external commands EX_CMD to be sequentially stored in the command storage unit 2120. The configuration and operation of the input control section 2111 will be described in detail with reference to FIG. 3.

The output control section 2112 generates a plurality of output control signals OUT_CTRL for controlling the internal commands IN_CMD stored in the command storage unit 2120 to be sequentially outputted in response to the clock signal CLK and an output enable signal OUT_EN in the test operation. The configuration and operation of the output control section 2112 will be described in detail with reference to FIG. 4.

Figure 3:
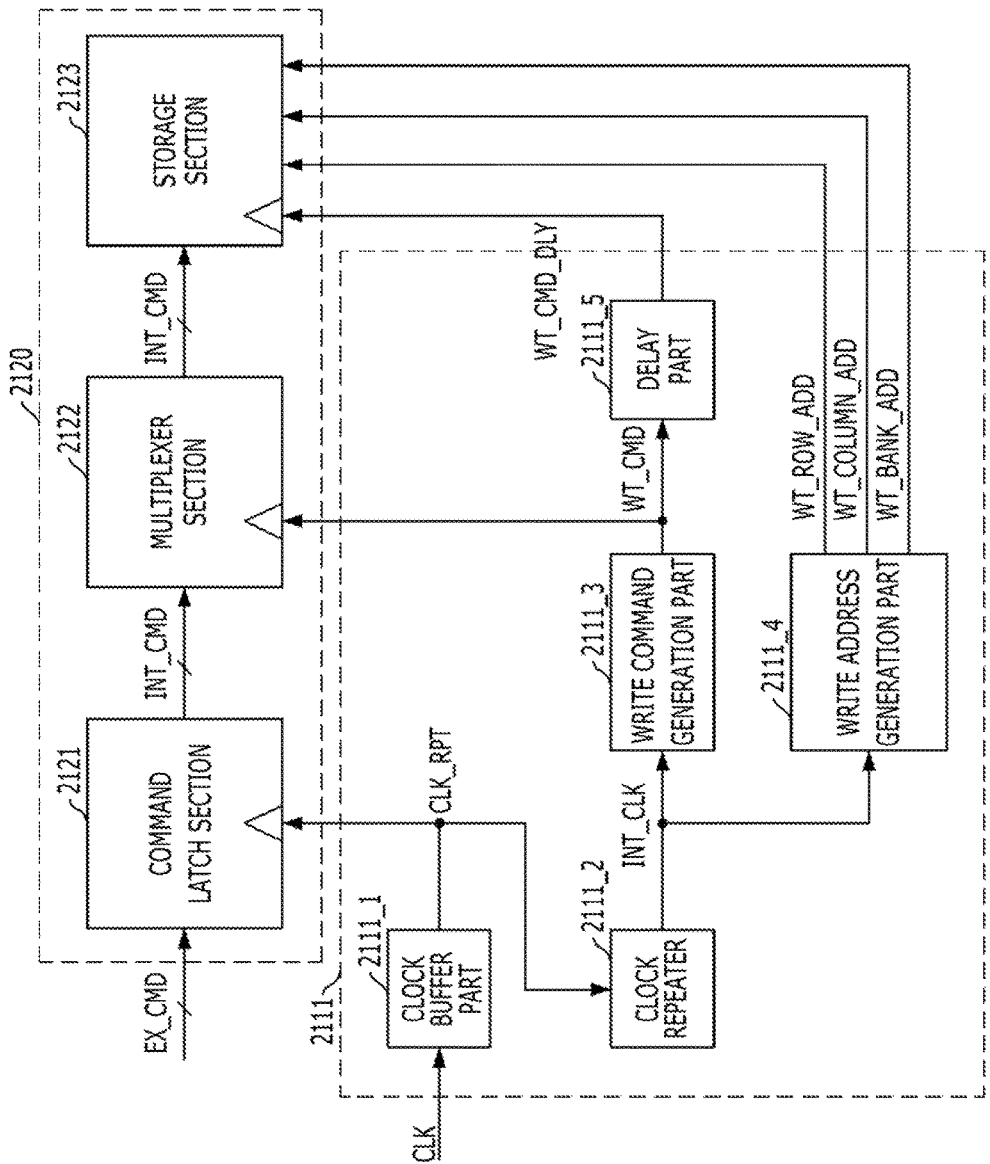
FIG. 3 is a detailed block diagram of an input control section and a command storage unit illustrated in FIG. 2 in accordance with an exemplary embodiment of the present invention.

FIG. 3 is a detailed block diagram of the input control section and the command storage unit illustrated in FIG. 2 in accordance with an exemplary embodiment of the present invention.

Referring to FIG. 3, the input control section 2111 may include a clock buffer part 2111_1, a clock repeater 2111_2, a write command generation part 2111_3, a write address generation part 2111_4, and a delay part 2111_5, and the command storage unit 2120 may include a command latch section 2121, a multiplexer section 2122, and a storage section 2123.

Only elements in the command storage unit 2120 necessary for storing external commands EX_CMD by the input control section 2111 are illustrated in FIG. 3 and elements necessary for output will be described in detail with reference to FIG. 4.

The clock buffer part 2111_1 buffers the clock signal CLK and outputs a buffered clock signal CLK_RPT. The buffered clock signal CLK_RPT is inputted as a control signal of the command latch section 2121.

The command latch section 2121 receives the external commands EX_CMD, latches the external commands EX_CMD in synchronization with the buffered clock signal CLK_RPT, and outputs latched internal commands INT_CMD.

The clock repeater 2111_2 compensates for the buffered clock signal CLK_RPT level and generates an internal clock signal INT_CLK.

The write command generation part 2111_3 generates an internal write command WT_CMD for controlling the latched internal command INT_CMD to be stored in the multiplexer section 2122 in response to the internal clock signal INT_CLK. The internal write command WT_CMD is generated at each rising edge of the internal clock signal INT_CLK.

The multiplexer section 2122 outputs the internal commands INT_CMD in synchronization with the internal write command WT_CMD. The outputted internal commands INT_CMD are loaded on a global line for output.

The write address generation part 2111_4 generates a plurality of write address signals WT_ROW_ADD, WT_COLUMN_ADD, and WT_BANK_ADD for designating storage positions of the internal commands INT_CMD in response to the internal clock signal INT_CLK. The plurality of generated write address signals WT_ROW_ADD, WT_COLUMN_ADD, and WT_BANK_ADD are inputted as control signals of the storage section 2123.

The write address generation part 2111_4 generates an address increment signal at each rising edge of the internal clock signal INT_CLK. The write address generation part 2111_4 may generate the signals in the sequence of the row address WT_ROW_ADD, the column address WT_COLUMN_ADD, and the bank address WT_BANK_ADD, and designate positions in which the internal commands INT_CMD are to be stored.

The delay part 2111_5 delays the internal write command WT_CMD for a predetermined time and outputs a delayed internal write command signal WT_CMD_DLY. The delayed internal write command signal WT_CMD_DLY controls the internal commands INT_CMD to be stored in the storage section 2123.

The storage section 2123 sequentially stores the internal commands INT_CMD, which are outputted from the multiplexer section 2122, in the positions designated by the row address WT_ROW_ADD, the column address WT_COLUMN_ADD, and the bank address WT_BANK_ADD in synchronization with the delayed internal write command signal WT_CMD_DLY. Nonvolatile flash memory may be used as the storage section 2123.

The buffered clock signal CLK_RPT, the internal write command WT_CMD, the delayed internal write command WT_CMD_DLY, and the plurality of write address signals WT_ROW_ADD, WT_COLUMN_ADD, and WT_BANK_ADD, which are outputted from the input control section 2111, may be the plurality of input control signals IN_CTRL illustrated in FIG. 1 and FIG. 2.

Figure 4:
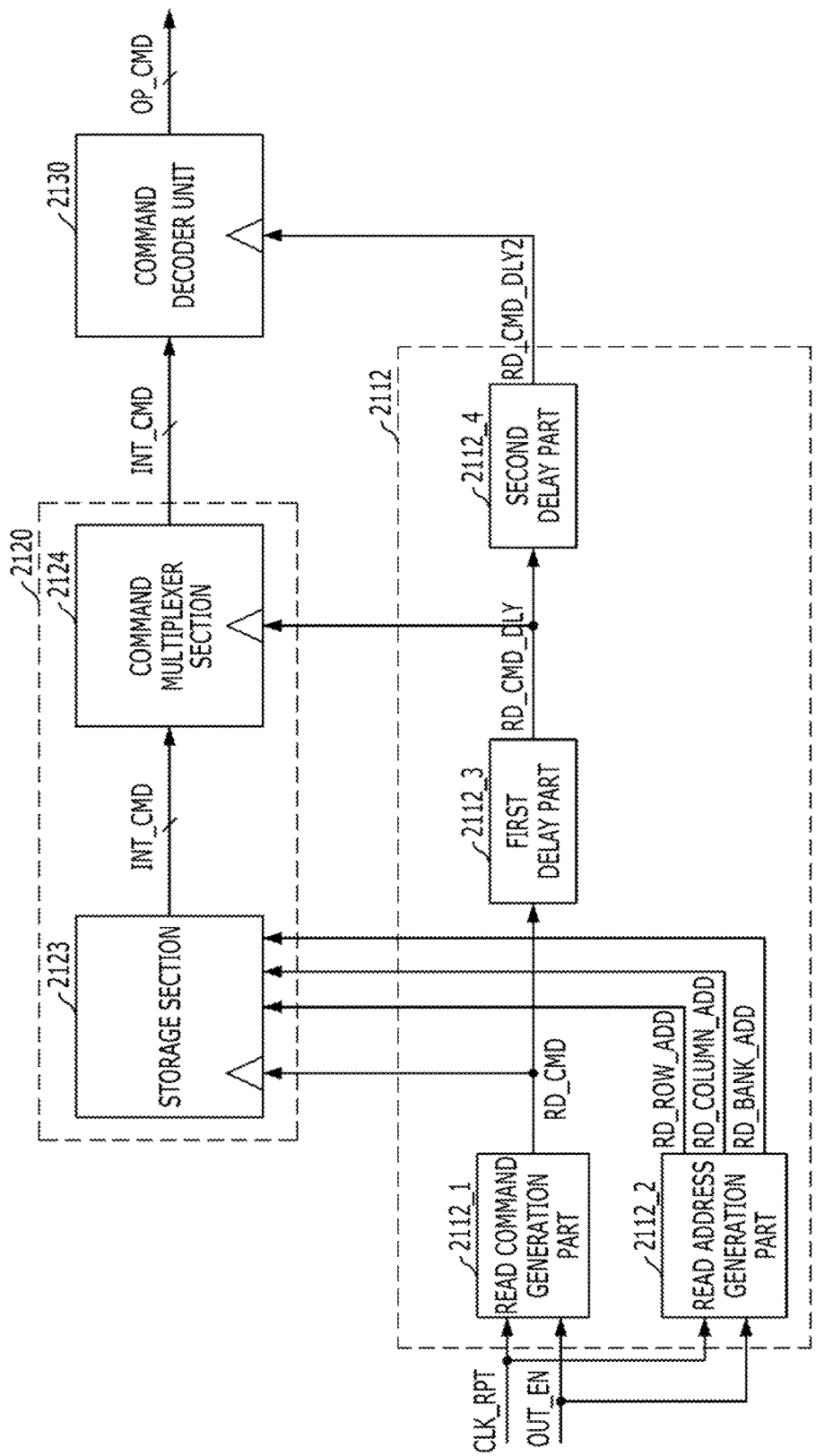
FIG. 4 is a detailed block diagram of an output control section and a command storage unit illustrated in FIG. 2 in accordance with an exemplary embodiment of the present invention.

FIG. 4 is a detailed block diagram of the output control section and the command storage unit illustrated in FIG. 2 in accordance with an exemplary embodiment of the present invention.

Referring to FIG. 4, the output control section 2112 may include a read command generation part 2112_1 and a read address generation part 2112_2, and the command storage unit 2120 may include a storage section 2123 and a command multiplexer section 2124.

As elements of the command storage unit 2120, only elements necessary for outputting the internal commands IN_CMD by the output control section 2112 are illustrated, and elements necessary for input have been described in detail with reference to FIG. 3.

The read command generation part 2112_1 generates an internal read command signal RD_CMD for controlling the internal commands INT_CMD stored in the storage section 2123 to be outputted in response to the buffered clock signal CLK_RPT and the output enable signal OUT_EN. The buffered clock signal CLK_RPT is outputted through the clock buffer part 2111_1 among the elements of the input control section 2111, and the output enable signal OUT_EN is activated in the test operation and controls the internal commands INT_CMD to be outputted.

The read address generation part 2112_2 generates a plurality of read address signals RD_ROW_ADD, RD_COLUMN_ADD, and RD_BANK_ADD for designating the positions in which the internal commands INT_CMD have been stored in response to the buffered clock signal CLK_RPT and the output enable signal OUT_EN. The plurality of generated read address signals RD_ROW_ADD, RD_COLUMN_ADD, and RD_BANK_ADD are inputted as control signals of the storage section 2123.

The read address generation part 2112_2 generates an address increment signal at each rising edge of the buffered clock signal CLK_RPT. The read address generation part 2112_2 may generate the signals in the sequence of the row address RD_ROW_ADD, the column address RD_COLUMN_ADD, and the bank address RD_BANK_ADD, designate the positions in which the internal commands INT_CMD have been stored, and control the internal commands INT_CMD to be sequentially outputted.

Accordingly, the internal commands INT_CMD stored in the storage section 2123 are sequentially outputted based on the plurality of read address signals RD_ROW_ADD, RD_COLUMN_ADD, and RD_BANK_ADD in synchronization with the internal read command signal RD_CMD. The internal commands INT_CMD outputted from the storage section 2123 may be loaded on the global line for output.

The output control section 2112 may further include a first delay part 2112_3 and a second delay part 2112_4.

The first delay part 2112_3 may delay the internal read command signal RD_CMD outputted from the read command generation part 2112_1 for a predetermined time and control the command multiplexer section 2124, and the second delay part 2112_4 may delay a delayed first read command signal RD_CMD_DLY delayed through the first delay part 2112_3 for a predetermined time and control the command decoder unit 2130.

The command multiplexer section 2124 outputs the internal commands INT_CMD, which are outputted from the storage section 2123, in synchronization with the delayed first read command signal RD_CMD_DLY.

The command decoder unit 2130 decodes the internal commands INT_CMD, which are outputted from the command multiplexer section 2124, in response to a delayed second read command signal RD_CMD_DLY2 delayed through the second delay part 2112_4, and outputs the test command OP_CMD.

The test command OP_CMD is an operation command for driving of the memory core unit 2200 illustrated in FIG. 1, and may include active, read, write, refresh, precharge commands and the like.

The internal read command RD_CMD, the plurality of read address signals RD_ROW_ADD, RD_COLUMN_ADD, and RD_BANK_ADD, and the delayed first and second internal read command signals RD_CMD_DLY and RD_CMD_DLY2, which are outputted from the output control section 2112, may be the output control signals OUT_CTRL illustrated in FIG. 1 and FIG. 2.

Referring to FIG. 1 to FIG. 4, the external commands EX_CMD are sequentially stored in the command storage unit 2120 of the semiconductor memory 2000, and are sequentially outputted for use in the test operation.

Accordingly, memory cell arrays of the memory core unit 2200 of the semiconductor memory 2000 may be driven without control of an external device, that is, the memory controller 1000, in the test operation. Furthermore, all commands provided from the memory controller 1000 may be tested, thereby improving test coverage.

In addition, the internal commands INT_CMD stored in the command storage unit 2120 may be outputted to recognize command sequences, so that a test logic may be configured substantially the same as various applications.

Figure 5:
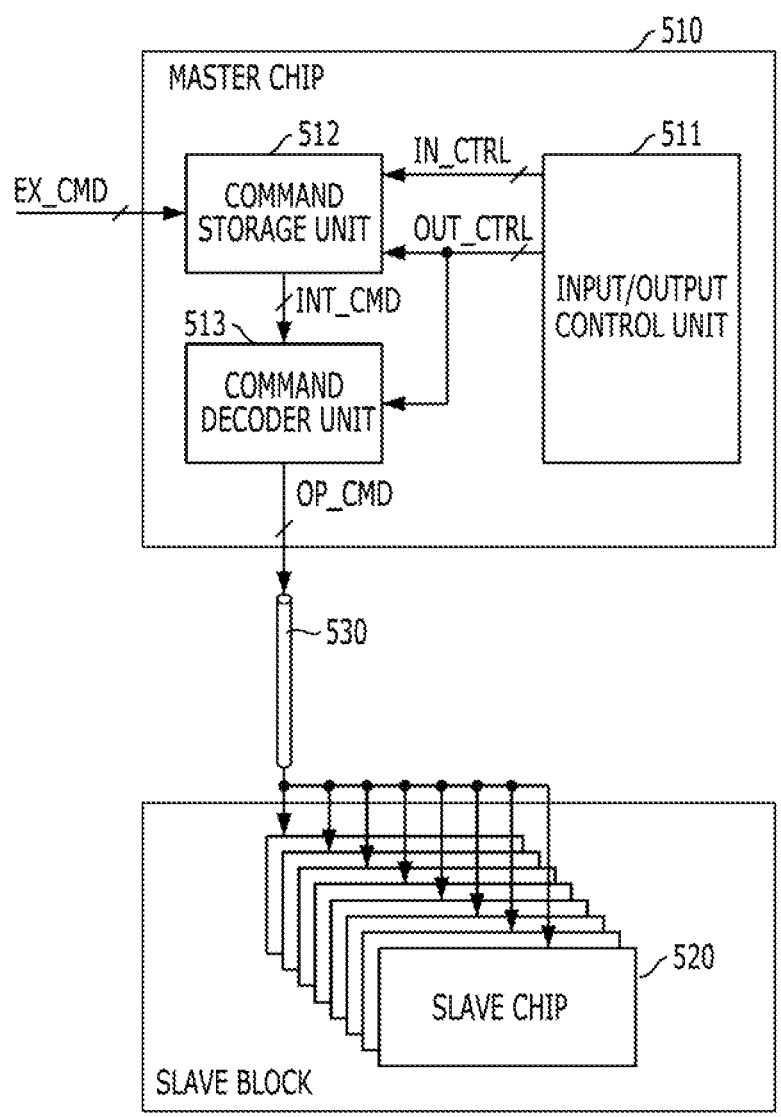
FIG. 5 is a block diagram illustrating a semiconductor device in accordance with a second exemplary embodiment of the present invention.

FIG. 5 is a block diagram illustrating a semiconductor device in accordance with a second exemplary embodiment of the present invention.

Referring to FIG. 5, the semiconductor device may include a master chip 510 and a plurality of slave chips 520.

The master chip 510 receives the external commands EX_CMD and sequentially stores the external commands EX_CMD therein, and sequentially outputs the test command OP_CMD for driving the plurality of slave chips 520 in the test operation. The master chip 510 may include an input/output control unit 511, a command storage unit 512, and a command decoder unit 513.

The input/output control unit 511 sequentially stores the external commands EX_CMD in the command storage unit 512, and controls the internal commands INT_CMD stored in the command storage unit 512 to be sequentially outputted in the test operation. At this time, the input/output control unit 511 outputs the input control signal IN_CTRL and the output control signal OUT_CTRL for controlling the input/output of the internal commands INT_CMD.

The command decoder unit 513 decodes the internal commands INT_CMD in response to the output control signal OUT_CTRL, and outputs the test command OP_CMD. The test command OP_CMD is an operation command for actual driving of the memory core unit 2200, and may include active, read, write, refresh, precharge commands and the like.

The master chip 510 illustrated in FIG. 5 may include the built-in self-test circuit 2100 illustrated in FIG. 1 to FIG. 4. The plurality of slave chips 520 may include the memory core unit 2200 illustrated in FIG. 1, and the configuration and operation thereof may be substantially the same.

The semiconductor device may further include a through electrode 530 that electrically couples the master chip 510 to the plurality of slave chips 520 by passing through them. The test command OP_CMD outputted from the master chip 510 may be transferred to the plurality of slave chips 520 through the through electrode 530.

Figure 6:
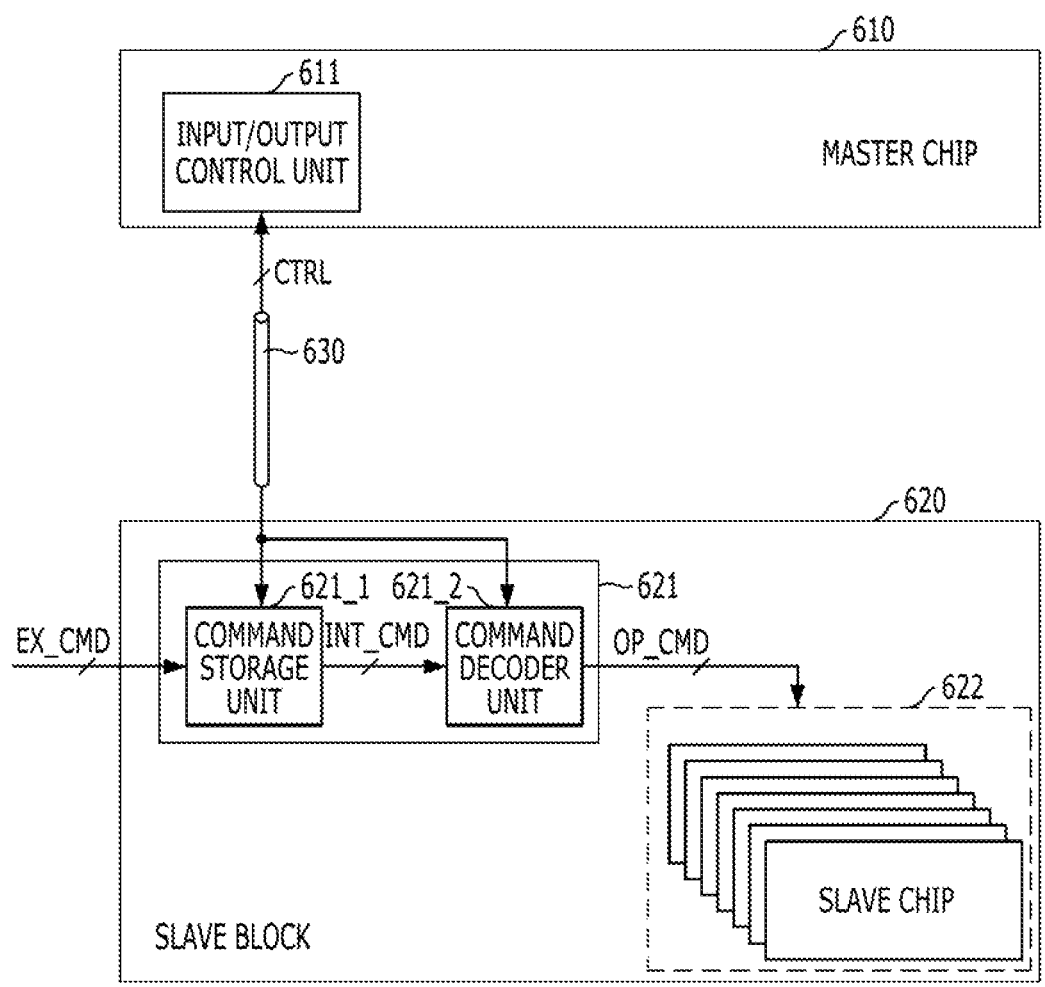
FIG. 6 is a block diagram illustrating a semiconductor device in accordance with a third exemplary embodiment of the present invention.

FIG. 6 is a block diagram illustrating a semiconductor device in accordance with a third exemplary embodiment of the present invention.

Referring to FIG. 6, the semiconductor device may include a master chip 610 and a slave block 620 including a plurality of slave chips.

The master chip 610 may include an input/output control unit 611, and one slave chip 621 of the plurality of slave chips may include a command storage unit 621_1 and a command decoder unit 621_2 as a test command generating unit.

The master chip 610 including the input/output control unit 611 generates an input/output control signal CTRL for controlling the external commands EX_CMD to be sequentially stored and outputted.

The one slave chip 621 of the plurality of slave chips stores the external commands EX_CMD in the command storage unit 621_1 by the input/output control signal CTRL, and decodes the stored internal commands INT_CMD through the command decoder unit 621_2 and outputs the test command OP_CMD in the test operation.

The other slave chips 622 include the memory core unit 2200 illustrated in FIG. 1, and may receive and drive the test command OP_CMD in the test operation.

The semiconductor device may further include a through electrode 630 that electrically couples the master chip 610 to the one slave chip 621, in which the external commands EX_CMD have been stored, by passing through them. At this time, the input/output control signal CTRL outputted from the master chip 610 may be transferred to the one slave chip 621 through the through electrode 630.

In FIG. 6, for the simple description, the through electrode 630 electrically couples the master chip 610 to the one slave chip 621. However, each of the other slave chips 622 may be electrically coupled to the through electrode 630. Accordingly, the test command OP_CMD may also be transferred to the plurality of slave chips 622 through the through electrode 630.

While this patent document contains many specifics, these should not be construed as limitations on the scope of any invention or of what may be claimed, but rather as descriptions of features that may be specific to particular embodiments. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

Although various embodiments have been described for illustrative purposes, it will be apparent to those skilled in the art that various changes and modifications may be made without departing from the spirit and scope of the invention as defined in the following claims.

What is claimed is:

1. A semiconductor device comprises:
    a test circuit suitable for receiving external commands, sequentially storing the external commands, and sequentially outputting stored commands as test commands in a test operation; and
    a memory core unit suitable for operating the test operation in response to the test commands from the test circuit in the test operation,
    wherein the test circuit and the memory core unit forms a semiconductor memory device,
    wherein the memory core unit is provided in a plurality of slave chips, and the test circuit is provided in a master chip,
    wherein the semiconductor memory device further comprises:
    a through electrode suitable for electrically coupling the master chip to the plurality of slave chips by passing through the master chip and the plurality of slave chips,
    wherein the test commands are transferred to the plurality of slave chips through the through electrode.

2. The semiconductor device of claim 1, wherein the test circuit comprises:
    a command storage unit suitable for storing the external commands;
    an input/output control unit suitable for controlling the command storage unit to sequentially store the external commands and sequentially output the stored commands as internal commands in the test operation; and
    a command decoder unit suitable for decoding the internal commands outputted from the command storage unit and outputting the test commands.

3. The semiconductor device of claim 2, wherein the semiconductor memory device further comprises:

a through electrode suitable for electrically coupling the master chip to the one of the plurality of slave chips by passing through the master chip and the one of the plurality of slave chips.

4. The semiconductor device of claim 2, wherein the input/output control unit transmits an input/output control signal for controlling the command storage unit and the command decoder unit through the through electrode.

5. The semiconductor device of claim 1, further comprising:
   a memory controller suitable for controlling the semiconductor memory device,
   wherein the memory controller provides the external commands to the semiconductor memory device.

6. A semiconductor device comprises:
   a master chip suitable for generating an input/output control signal for controlling external commands to be sequentially stored and outputted in a test operation:
   a slave block suitable for performing the test operation in response to the input/output control signal in the test operation,
   wherein the slave block comprises:
      a command storage unit suitable for storing the external commands and sequentially outputting the stored external commands as internal commands in the test operation; and
      a command decoder unit suitable for decoding the internal commands outputted from the command storage unit and outputting the test commands,
   wherein the slave block is provided in a plurality of slave chips, the command storage unit and the command decoder unit are provided in one of the plurality of slave chips, and the input/output control unit is provided in a master chip.

7. The semiconductor device of claim 6, wherein the input/output control unit transmits an input/output control signal for controlling the command storage unit and the command decoder unit through the through electrode.

8. The semiconductor device of claim 6, further comprising:
   a memory controller suitable for controlling the semiconductor memory device,
   wherein the memory controller provides the external commands to the semiconductor memory device.

* * * * *